(12) United States Patent
Cheng et al.

(10) Patent No.: US 10,402,289 B2
(45) Date of Patent: Sep. 3, 2019

(54) FINE-GRAINED CAUSAL ANOMALY INFERENCE FOR COMPLEX SYSTEM FAULT DIAGNOSIS

(71) Applicant: NEC Laboratories America, Inc., Princeton, NJ (US)

(72) Inventors: Wei Cheng, Plainsboro, NJ (US); Haifeng Chen, West Windsor, NJ (US); Guofei Jiang, Princeton, NJ (US); Jingchao Ni, Cleveland, OH (US)

(73) Assignee: NEC CORPORATION (JP)

( * ) Notice: Subject to any disclaimer, the term of this patent is extended or adjusted under 35 U.S.C. 154(b) by 194 days.

(21) Appl. No.: 15/661,625

(22) Filed: Jul. 27, 2017

(65) Prior Publication Data

US 2018/0067831 A1  Mar. 8, 2018

Related U.S. Application Data

(60) Provisional application No. 62/384,228, filed on Sep. 7, 2016.

(51) Int. Cl.
*G06F 11/00* (2006.01)
*G06F 11/22* (2006.01)
*G06N 5/04* (2006.01)
*G06F 17/50* (2006.01)
*G06N 20/00* (2019.01)

(52) U.S. Cl.
CPC .......... *G06F 11/2257* (2013.01); *G06F 17/50* (2013.01); *G06N 5/048* (2013.01); *G06N 20/00* (2019.01)

(58) Field of Classification Search
CPC .................................................. G06F 11/2257
See application file for complete search history.

(56) References Cited

U.S. PATENT DOCUMENTS

| 5,661,668 | A  | * | 8/1997 | Yemini | ............... | G06F 11/2257 702/186 |
| 7,043,661 | B2 | * | 5/2006 | Valadarsky | ......... | H04L 41/0604 379/15.05 |
| 7,721,152 | B1 | * | 5/2010 | Joshi | .................... | G06F 11/0709 714/15 |
| 8,271,492 | B2 | * | 9/2012 | Nagai | ................. | G06F 11/0727 707/736 |

(Continued)

OTHER PUBLICATIONS

Mohamed Bouguessa, "Unsupervised Anomaly Detection in Transactional Data," 2012 11th International Conference on Machine Learning and Applications. Dec. 12-15, 2012. pp. 526-531.

(Continued)

*Primary Examiner* — Christopher S McCarthy
(74) *Attorney, Agent, or Firm* — Joseph Kolodka

(57) ABSTRACT

A computer-implemented method for diagnosing system faults by fine-grained causal anomaly inference is presented. The computer-implemented method includes identifying functional modules impacted by causal anomalies and back-tracking causal anomalies in impaired functional modules by a low-rank network diffusion model. An invariant network and a broken network are inputted into the system, the invariant network and the broken network being jointly clustered to learn a degree of broken severities of different clusters as a result of fault propagations.

7 Claims, 4 Drawing Sheets

(56) References Cited

U.S. PATENT DOCUMENTS

| | | | |
|---|---|---|---|
| 8,984,116 B2* | 3/2015 | Ge | H04L 43/04 709/223 |
| 9,021,077 B2* | 4/2015 | Nagai | G06F 11/0709 702/181 |
| 9,189,730 B1* | 11/2015 | Coenen | G06N 3/049 |
| 9,489,623 B1* | 11/2016 | Sinyavskiy | G06N 3/084 |
| 9,558,056 B2* | 1/2017 | Sasturkar | G06F 11/0709 |
| 2005/0188240 A1* | 8/2005 | Murphy | G06F 11/0709 714/4.4 |
| 2009/0292954 A1* | 11/2009 | Jiang | G06F 11/0709 714/47.2 |
| 2013/0110761 A1* | 5/2013 | Viswanathan | G06N 20/00 706/52 |
| 2013/0219223 A1* | 8/2013 | Jiang | G06F 11/079 714/37 |
| 2014/0047279 A1* | 2/2014 | Sharma | G06F 11/079 714/39 |
| 2014/0129876 A1* | 5/2014 | Addepalli | H04L 41/064 714/37 |
| 2017/0228277 A1* | 8/2017 | Cheng | G06F 11/0709 |
| 2018/0131560 A1* | 5/2018 | Cheng | H04L 41/0631 |
| 2018/0299877 A1* | 10/2018 | Cheng | G06F 11/0709 |
| 2018/0307994 A1* | 10/2018 | Cheng | G05B 23/00 |

OTHER PUBLICATIONS

Chen et al., "Exploiting Local and Global Invariants for the Management of Large Scale Information Systems," 2008 8th IEEE International Conference on Data Mining. Dec. 15-19, 2008. pp. 113-122.

Cheng et al., "Ranking Causal Anomalies via Temporal and Dynamical Analysis on Vanishing Correlations," 22nd ACM SIGKDD Conference on Knowledge Discovery and Data Mining (KDD). Aug. 13-17, 2016. pp. 1-10.

Ge et al., "Ranking Metric Anomaly in Invariant Networks," ACM Transactions on Knowledge Discovery from Data. vol. 8, No. 2. May 2014. pp. 1-30.

Hara et al., "A Consistent Method for Graph Based Anomaly Localization," Proceedings of the 18th International Conference. Artificial Intelligence and Statistics 2015. Feb. 21, 2015. pp. 333-341.

Hirose et al., "Network Anomaly Detection based on Eigen Equation Compression," Proceedings of the 15th ACM SIGKDD International Conference on Knowledge Discovery and Data Mining. Jun. 28-Jul. 1, 2009. pp. 1185-1194.

Ide et al., "Computing Correlation Anomaly Scores using Stochastic Nearest Neighbors," In Data Mining, 2007. Seventh IEEE International Conference on Data Mining. Oct. 28, 2007. pp. 1-6.

Ide et al., "Proximity-Based Anomaly Detection using Sparse Structure Learning," Proceedings of the 2009 SIAM International Conference on Data Mining. Apr. 30, 2009. pp. 97-108.

Jiang et al., "Discovering Likely Invariants of Distributed Transaction Systems for Autonomic System Management," 2006 IEEE International Conference on Autonomic Computing. Jun. 12-16, 2006. pp. 199-208.

Jiang et al., "Modeling and Tracking of Transaction Flow Dynamics for Fault Detection in Complex Systems," IEEE Transactions on Dependable and Secure Computing. vol. 3. No. 4. Oct.-Dec. 2006. pp. 312-326.

Lyu et al., "On Algorithms for Sparse Multi-factor NMF," Advances in Neural Information Processing Systems 26 from Neural Information Processing Systems Conference 2013. Dec. 5-10, 2013. pp. 1-9.

Tan et al., "Fine-Grained Causal Anomaly Inference for Complex System Fault Diagnosis," 2012 IEEE 32nd International Conference on Distributed Computing Systems. Jun. 18-21, 2012. pp. 1-9.

Tan et al., "Fine-Grained Causal Anomaly Inference for Complex System Fault Diagnosis (Supplementary Material)," 2012 IEEE 32nd International Conference on Distributed Computing Systems. Jun. 18-21, 2012. pp. 1-3.

Tao et al., "Metric Ranking of Invariant Networks with Belief Propagation," 2014 IEEE International Conference on Data Mining. Dec. 14-17, 2014. pp. 1-6.

Wang et al., "Structured Doubly Stochastic Matrix for Graph Based Clustering," Proceedings of the 22nd ACM International Conference on Knowledge Discovery and Data Mining. Aug. 13-17, 2016. pp. 1245-1254.

Yang et al., "Low-Rank Doubly Stochastic Matrix Decomposition for Cluster Analysis," Journal of Machine Learning Research. vol. 17. Oct. 2016. pp. 1-25.

Zass et al., "Doubly Stochastic Normalization for Spectral Clustering," 2006 Proceedings of the 19th International Conference on Neural Information Processing Systems. Dec. 4-7, 2006. pp. 1569-1576.

Zhou et al., "Learning with Local and Global Consistency," 2003 Proceedings of the 16th International Conference on Neural Information Processing Systems. Dec. 9-11, 2003. pp. 321-328.

* cited by examiner

FINE-GRAINED CAUSAL ANOMALY INFERENCE FOR COMPLEX SYSTEM FAULT DIAGNOSIS

RELATED APPLICATION INFORMATION

This application claims priority to Provisional Application No. 62/384,228, filed on Sep. 7, 2016, incorporated herein by reference in its entirety.

BACKGROUND

Technical Field

The present invention relates to diagnosing system faults and, more particularly, to fine-grained causal anomaly inference for complex system fault diagnosis.

Description of the Related Art

Diagnosing system faults is an issue in managing large-scale running systems. A timely identification of root causes to a system problem can help avoid business losses. Often in a complex system, the working status of its different system components are monitored in various manners, such as flow intensity time series recorded in log files of an information technology (IT) system or sensory measurements in a physical system. By analyzing monitoring data, it can be determined whether there is a system failure and what system components are sources of anomalies, or causal anomalies. However, because of their sizes and complexities, a manual inspection of the entire monitoring data is often not feasible. Therefore, significant research has been focused on developing algorithms to automate causal anomaly inference procedures.

SUMMARY

A computer-implemented method for diagnosing system faults by fine-grained causal anomaly inference is presented. The method includes identifying functional modules impacted by causal anomalies and backtracking causal anomalies in impaired functional modules by a low-rank network diffusion model.

A system for diagnosing system faults by fine-grained causal anomaly inference is presented. The system includes a memory and a processor in communication with the memory, wherein the processor is configured to identify functional modules impacted by causal anomalies and backtrack causal anomalies in impaired functional modules by a low-rank network diffusion model.

A non-transitory computer-readable storage medium including a computer-readable program for diagnosing system faults by fine-grained causal anomaly inference is presented, wherein the computer-readable program when executed on a computer causes the computer to perform the steps of identifying functional modules impacted by causal anomalies and backtracking causal anomalies in impaired functional modules by a low-rank network diffusion model.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In the exemplary embodiments of the present invention, a cluster ranking based fault diagnosis (CRD) system and method is provided for locating true causal anomalies for a system fault. CRD is a two-phase framework. In a first phase, a cluster ranking problem is solved. The goal is to jointly cluster networks and learn degrees of broken severities of different clusters. In a second phase, a low-rank network diffusion model is provided to backtrack causal anomalies with guidance from the results of the first phase. The benefits are two-fold. First, CRD can narrow down a search space of causal anomalies by looking primarily at severely broken clusters. Second, CRD can accurately model local propagation patterns of causal anomaly impacts.

In the exemplary embodiments of the present invention, an AutoRegressive eXogenous (ARX) model is used to learn relationships between all pairs of a time series. This technique evaluates a correlation between a pair of time series (monitored on two components) in terms of their short term trends in training data. If such a learned correlation can be validated as strong in the testing data, it is regarded as an invariant between the pair of time series. By collecting all invariants between all pairs of a time series, an invariant network is formed. Moreover, at any future time point t, if an invariant cannot be validated (as indicated by a prediction error), this invariant is considered as broken. The network formed by all broken invariants is referred to as a broken network at time t.

The invariant network is represented by its adjacency matrix $A \in R_+^{n \times n}$, where n is the number of nodes in the network. $A_{xy}$ measures correlation between nodes x and y. At a time t, w.l.o.g., the broken network is represented by $B \in \{0,1\}^{n \times n}$, $B_{xy}=1$ if the invariant between nodes x and y is broken at time t; $B_{xy}=0$ otherwise.

In one example, suppose there are k clusters formed by the system components. Then the goal is to infer for each node x, the cluster membership probability $P(i|x)$ in the cluster ($1 \leq i \leq k$), the broken score $s_i$ indicating the broken degree of each cluster i, as well as a causal anomaly score $f_x$ for each node x.

In the first phase, a broken cluster ranking is performed. The invariant network and broken network are complementary in clustering structures. Specifically, system components that work coordinately in normal status while broke simultaneously in abnormal status are more likely to be in a same functional module (e.g., cluster). Therefore, jointly clustering invariant and broken networks can improve accuracy in identifying broken clusters, thus benefitting anomaly inference.

Figure 1:
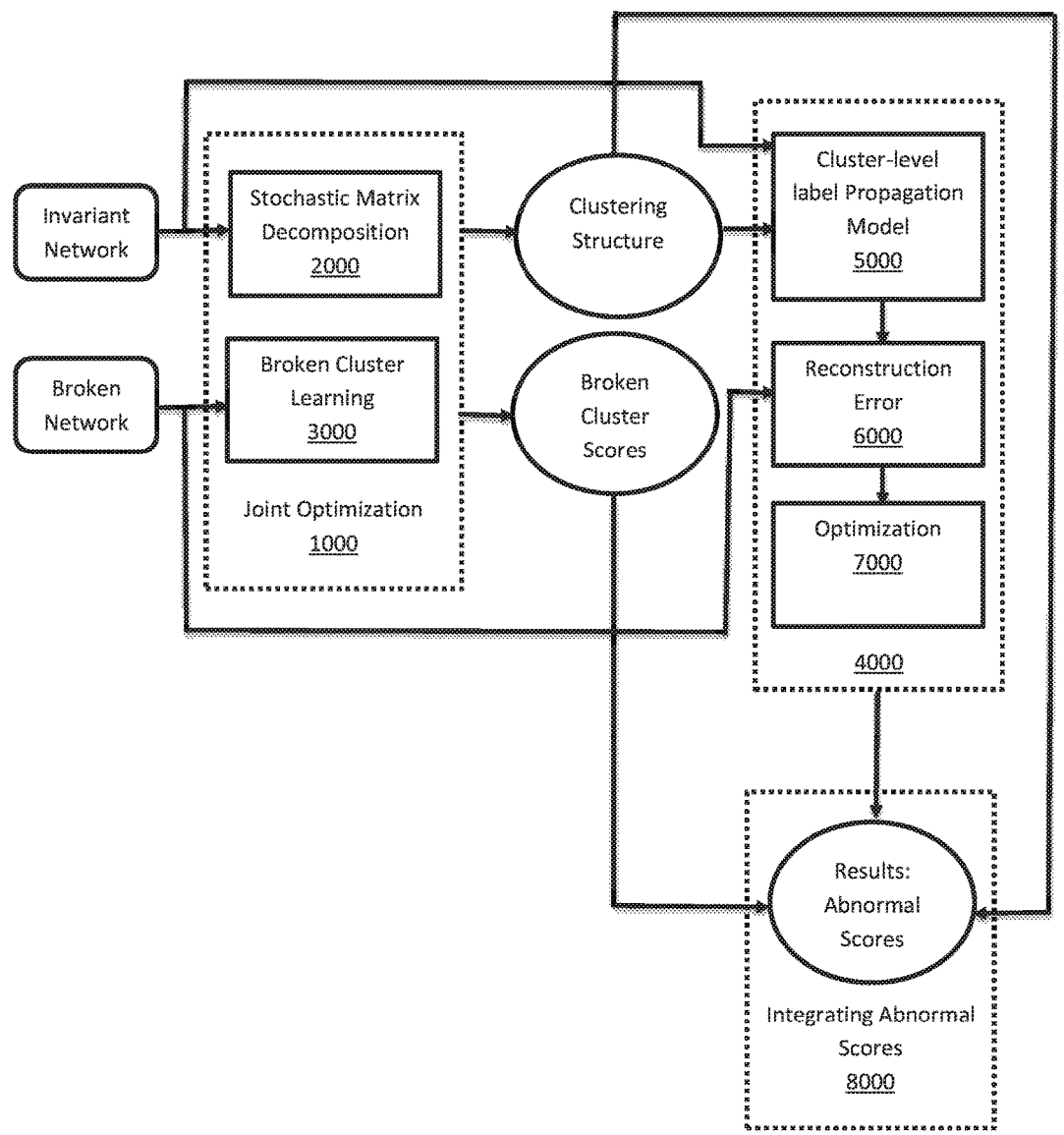
FIG. 1 is a block/flow diagram illustrating a cluster ranking based fault diagnosis (CRD) system for locating true causal anomalies for a system fault, in accordance with embodiments of the present invention.

FIG. 1 shows a workflow of a causal anomaly inference algorithm.

The agent 1000 is a network clustering and broken cluster score learning module and includes two sub-modules, 2000 and 3000, which are unified in a joint optimization problem, the problem being solved by an iterative algorithm.

The agent 2000 is an invariant network clustering module, which employs a stochastic matrix decomposition approach.

The agent 3000 models generation of a broken network. In the process, it learns a broken score for each cluster in the network to indicate its broken degree.

The agent 4000 is a causal anomaly inference module, which includes three sub-modules, 5000, 6000, and 7000.

The agent 5000 is a label propagation model, which incorporates clustering results of module 1000 to guide the propagation process starting from several seed anomalies, in different clusters in the invariant network.

The agent 6000 models a reconstruction error of the propagated anomalies and the broken network.

The agent 7000 is an iterative optimization algorithm for computing several causal anomaly vectors, each for a cluster in the invariant network.

The agent 8000 integrates the clustering results, broken cluster score results, and anomaly score results into a final causal anomaly score vector, so as to accurately reflect multiple fault propagations that occur in different clusters in the invariant network.

Module 2000: Invariant Network Clustering

A doubly stochastic matrix decomposition approach is adopted as a basic clustering method, which is superior in clustering real-world sparse networks.

Let $A \in \mathbb{R}^{n \times n}$ be an adjacency matrix of an invariant network, where n is a number of nodes. Without preference to any particular nodes, a uniform prior $P(x)=1/n$ is imposed for each node x in A. Suppose there are k clusters in A, then let i be a cluster variable, and x, y and z be node variables.

A conditional probability $P(x|y)$ can be represented by cluster membership probabilities $\{P(i|x), P(i|y), P(i|z)\}$ as:

$$P(x \mid y) = \sum_{i=1}^{k} \frac{P(i \mid x) P(i \mid y)}{\sum_{z=1}^{n} P(i \mid z)} \quad (1)$$

From Eq. (1), the following can be derived: $P(x|y)=P(y|x)$.

A matrix $\hat{A} \in \mathbb{R}^{n \times n}$ is defined with $\hat{A}_{xy}=P(x|y)=P(y|x)$, and then $\hat{A}$ is called a doubly stochastic matrix. Note $\hat{A}$ is symmetric and both of its columns and rows sum up to 1. It has been shown that a doubly stochastic approximation to an adjacency matrix usually gives robust clustering performance.

Let $U \in \mathbb{R}^{n \times k}$ be a cluster membership matrix with $U_{xi}=P(i|x)$, where k is the number of clusters. Eq (1) can be rewritten as:

$$\hat{A}_{xy} = \sum_{i=1}^{k} \frac{U_{xi} U_{yi}}{\sum_{z=1}^{n} U_{zi}} \quad (2)$$

The doubly stochastic matrix decomposition problem involves inferring U by minimizing an approximation error $D_{KL}(A\|\hat{A})$, where $D_{KL}(\cdot\|\cdot)$ is the KL-Divergence.

That is, to minimize (after removing some constants):

$$-\sum_{(x,y) \in E_A} A_{xy} \log \hat{A}_{xy} \quad (3)$$

where $E_A$ is a set of edges in A. To provide complexity control, a Dirichlet prior on U is introduced, and the following objective function is reached to cluster an invariant network:

$$\mathcal{J}_A = -\sum_{(x,y) \in E_A} A_{xy} \log \hat{A}_{xy} - (\alpha - 1) \sum_{xi} \log U_{xi} \quad (4)$$

$$\text{s.t. } U \geq 0, \sum_i U_{xi} = 1, \forall\, 1 \leq x \leq n$$

where $\alpha$ ($\alpha>0$) is a hyperparameter in the Dirichlet distribution. The equality constraints preserve a probabilistic interpretation of $U_{xi}$.

Module 3000: Learning Broken Clusters

Let $B \in \{0,1\}^{n \times n}$ be an adjacency matrix of a broken network at time t, where $B_{xy}=1$ if an invariant between nodes x and y is broken at time t; $B_{xy}=0$ otherwise. A broken network B records broken invariants at a given time. It is a subnetwork of the invariant network A. Thus, it should share some sub-clusters with A, indicating whether the sub-clusters are broken as a result of fault propagations. To measure a broken degree of a cluster, for each cluster i, a broken score $s_i$ is defined, which is enforced to be in [0, 1] s.t. different $s_i$'s are comparable.

In the following, the generation of a broken network is modeled. The hypothesis is that an invariant (x,y) is more likely to be "broke" if both x and y reside in a cluster with a high broken score $s_i$. As a result, a probability that an invariant is broken is defined as:

$$P_b(x, y) = \sum_{i=1}^{k} U_{xi} U_{yi} s_i \quad (5)$$

Note $P_b(x,y)$ is large only if nodes x and y belong to the same cluster i and cluster i has a high broken score $s_i$. Then the following generative process is introduced:

$$B_{xy} \sim \text{Bernoulli}(P_b(x,y)) \quad (6)$$

This generative process simulates the "broke" of an invariant.

Consequently, let $E_B$ be a set of edges in B, and then a probability to collectively generate a broken network can be represented by:

$$P(B \mid U, s) = \prod_{(x,y) \in E_B} P_b(x, y) \prod_{(x,y) \notin E_B} (1 - P_b(x, y)) \quad (7)$$

Let $W \in \{0,1\}^{n \times n}$ be an indicator matrix, $W_{xy}=1$ iff $A_{xy}>0$ but $B_{xy}=0$, e.g., (x,y) is a non-broken invariant link.

Then the negative log-likelihood function can be defined as:

$$\mathcal{J}_B = -\sum_{xy} B_{xy}\log\left(\sum_i U_{xi}U_{yi}s_i\right) - \sum_{xy} W_{xy}\log\left(1 - \sum_i U_{xi}U_{yi}s_i\right) \quad (8)$$

which is the objective function for broken cluster learning.

Module 1000: Jointly clustering the invariant network and broken network and learning broken cluster scores. Module 1000 includes two sub-modules, that is, 2000 and 3000.

The invariant network and the broken network are complementary in clustering structures. Specifically, system components that work coordinately in normal status while broke simultaneously in abnormal status are more likely to be in the same functional module (e.g., cluster). Therefore, jointly clustering invariant and broken networks can improve accuracy in identifying broken clusters, thus benefitting anomaly inference.

To enhance broken cluster identification performance, $J_A$ is integrated in Eq. (4) and $J_B$ is integrated in Eq. (8) into a joint optimization problem:

$$\min_{U,s\geq 0} \mathcal{J}_{CR}(U,s) = \mathcal{J}_A + \beta \mathcal{J}_B \quad (9)$$

$$\text{s.t.} \sum_i U_{xi} = 1, \forall 1 \leq x \leq n, s_i \leq 1, \forall 1 \leq i \leq k$$

where $\beta$ is a parameter to balance the importances of $J_A$ and $J_B$. Intuitively, the more reliable the broken network, the larger the value of $\beta$.

Eq. (9) can be solved by the following iterative optimization algorithm, which is implemented alternately between U and s until convergence.

$$U_{xu} \leftarrow U_{xu} \frac{a_x(\nabla_U)_{xu}^- + 1}{a_x(\nabla_U)_{xu}^+ + b_x} \quad (12)$$

$$s_i \leftarrow s_i^*, \text{ where } s_i^* = \min(s_i[(\nabla_s)_i^-/(\nabla_s)_i^+], 1) \quad (15)$$

where $$a_x = \sum_{u=1}^k \frac{U_{xu}}{(\nabla_U)_{xu}^+}, b_x = \sum_{u=1}^k U_{xu}\frac{(\nabla_U)_{xu}^-}{(\nabla_U)_{xu}^+}$$

$$(\nabla_U)_{xi}^+ = 2(ZU)_{xi}h_i^{-1} + \alpha U_{xi}^{-1} + 2\beta(YU)_{xi}s_i$$

$$(\nabla_U)_{xi}^- = (U^T ZU)_{ii}h_i^{-2} + U_{xi}^{-1} + 2\beta(WU)_{xi}s_u$$

$$(\nabla_s)_i^+ = \beta(U^T WU)_{ii} + s_i^{-1}$$

$$(\nabla_s)_i^- = \beta(U^T YU)_{ii} + \gamma s_i^{-1}$$

and $$Z_{xy} = A_{xy}\left(\sum_i \frac{U_{xi}U_{yi}}{\sum_z U_{zi}}\right)^{-1}, h_i = \sum_z U_{zi}$$

$$Y_{xy} = B_{xy}\left(\sum_i U_{xi}U_{yi}s_i\right)^{-1}$$

Module 4000: Causal Anomaly Inference

Module 4000 includes three sub-modules, that is, 5000, 6000 and 7000.

Module 5000: Cluster-level Label Propagation Model

A system failure occurs because of a set of root causes, or causal anomalies. As time flows, causal anomalies can propagate their impacts towards neighbors along paths as represented by invariant links in A.

Suppose a seed vector is $e \in \mathbb{R}^{n \times 1}$ with $e_x$ denoting a degree that node x is a causal anomaly. After propagation, each node x obtains a status score $r_x$ to indicate how much it is impacted by root causes. This process can be simulated by a label propagation model as follows:

$$\min_{r\geq 0} cr^T(I_n - \tilde{A})r + (1-c)\|r - e\|_F^2 \quad (16)$$

where $I_n$ is an n-by-n identity matrix, $$\tilde{A} = D^{-\frac{1}{2}}AD^{-\frac{1}{2}}$$

is a symmetrically normalized matrix of A, D is a diagonal matrix with $D_{xx} = \sum_{y=1}^n A_{xy}$.

The first term in Eq. (16) is a smoothness constraint, which encourages neighboring nodes to have similar status scores. The second term is a seed preference term, which penalizes large bias from the initial seeds, e.g., causal anomalies.

c is a parameter balancing the two terms. It can be verified that the closed-form solution to Eq. (16) is:

$$r = (1-c)(I_n - c\tilde{A})^{-1}e \quad (17)$$

which establishes an explicit relationship between r and e.

Module 6000: Reconstruction Error

Causal anomalies often propagate impacts inside their associated clusters, and different broken clusters can have different sets of causal anomalies.

Thus, for each cluster i, $e^{(i)} \in \mathbb{R}^{n \times 1}$ is defined as a cluster-specific seed vector. To explicitly identify causal anomalies that harm a cluster i, $U_{xi}e_x$ is regarded as a causal anomaly score of node x, where $U_{xi}$ is obtained in Module 1000. This suggests that x should reside in cluster i (e.g., high $U_{xi}$) and is abnormal (e.g., high $e_x$).

Correspondingly, it is assumed that propagations in different clusters are run independently, generating different status score vectors: $r^i \in \mathbb{R}^{n \times 1}$.

Then the propagation relationship between $e^{(i)}$ and $r^{(i)}$ can be represented by:

$$r^{(i)} = (1-c)(I_n - c\tilde{A})^{-1}(U_{*i} \circ e^{(i)}) \quad (18)$$

where $\circ$ is entry-wise product, $U_{*i}$ is the $i^{th}$ column of U.

Since the goal is to backtrack, $\{e^{(1)}, e^{(2)}, \ldots, e^{(k)}\}$, $\{r^{(1)}, r^{(2)}, \ldots, r^{(k)}\}$ is used to reconstruct the broken network B. Intuitively, when there is a broken invariant (x,y), e.g., $B_{xy}$ is large, then at least one node of x and y should be impaired by some causal anomalies from some clusters. That is, either $r_x^{(i)}$ or $r_y^{(i)}$ is large for some i.

This suggests the following reconstruction error:

$$\sum_{(x,y)\in E_A}\left(\sum_{i=1}^k r_x^{(i)}r_y^{(i)} - B_{xy}\right)^2 \quad (19)$$

Equivalently, let $E=[e^{(1)}, \ldots, e^{(k)}]$, $H=(1-c)(I_n-c\tilde{A})^{-1}$, and $C \in \{0,1\}^{n \times n}$ with $C_{xy}=1$ iff $(x,y) \in E_A$.

Eq. (19) can be rewritten by a matrix form and formulate an optimization problem:

$$\min_{E \geq 0} \mathcal{J}_{\hat{H}} = \left\| C \circ \left( \hat{H}(U \circ E)(U \circ E)^T \hat{H}^T \right) - B \right\|_F^2 + \tau \|E\|_1 \quad (22)$$

where $\hat{H}$ is an efficient approximation of H by iteratively updating $$\hat{H}^{(t+1)} \leftarrow c\tilde{A}\hat{H}^{(t)} + (1-c)I_n$$

until convergence. The convergence is guaranteed.

In Eq. (22), an $l_1$ norm is added on E to encourage sparsity of E since often only a few nodes are causal anomalies. $\tau$ is a controlling parameter, a larger $\tau$ typically results in more zeros in E.

Module 7000: Optimization

Eq. (22) can be solved by the following iterative optimization algorithm:

$$E_{xu} \leftarrow E_{xu} \left( \frac{4(\Phi \circ U)_{xu}}{4(\Theta \circ U)_{xu} + \tau} \right)^{\frac{1}{4}} \quad (24)$$

where $$\Theta = \hat{H}^T [C \circ (\hat{H}(U \circ E)(U \circ E)^T)] \hat{H}(U \circ E)$$

$$\Phi = [\hat{H}^T (B \circ C) \hat{H}](U \circ E)$$

The updating rule in Eq. (24) is provably convergent.

Module 8000: Integrating Abnormal Scores

After obtaining E from Eq. (24), a node x can be identified with a high $U_{xi} e_x^{(i)}$ score as a causal anomaly for cluster i, when cluster i has a high broken score $s_i$ (obtained in Module 1000).

For easy examination purpose, node anomaly scores are integrated in different clusters into a unified score $f_x$ for each node x. Ideally, $f_x$ is large if x is a causal anomaly to some cluster i (e.g., high $U_{xi} e_x^{(i)}$) and cluster i is broken severely (e.g., high $s_i$).

This suggests $f_x = U_{xi} e_x^{(i)} s_i$.

Equivalently:

$$f = (U \circ E)s \quad (23)$$

The unified causal anomaly score vector f can accurately reflect local propagations of causal anomaly impacts that are launched in multiple clusters.

Figure 2:
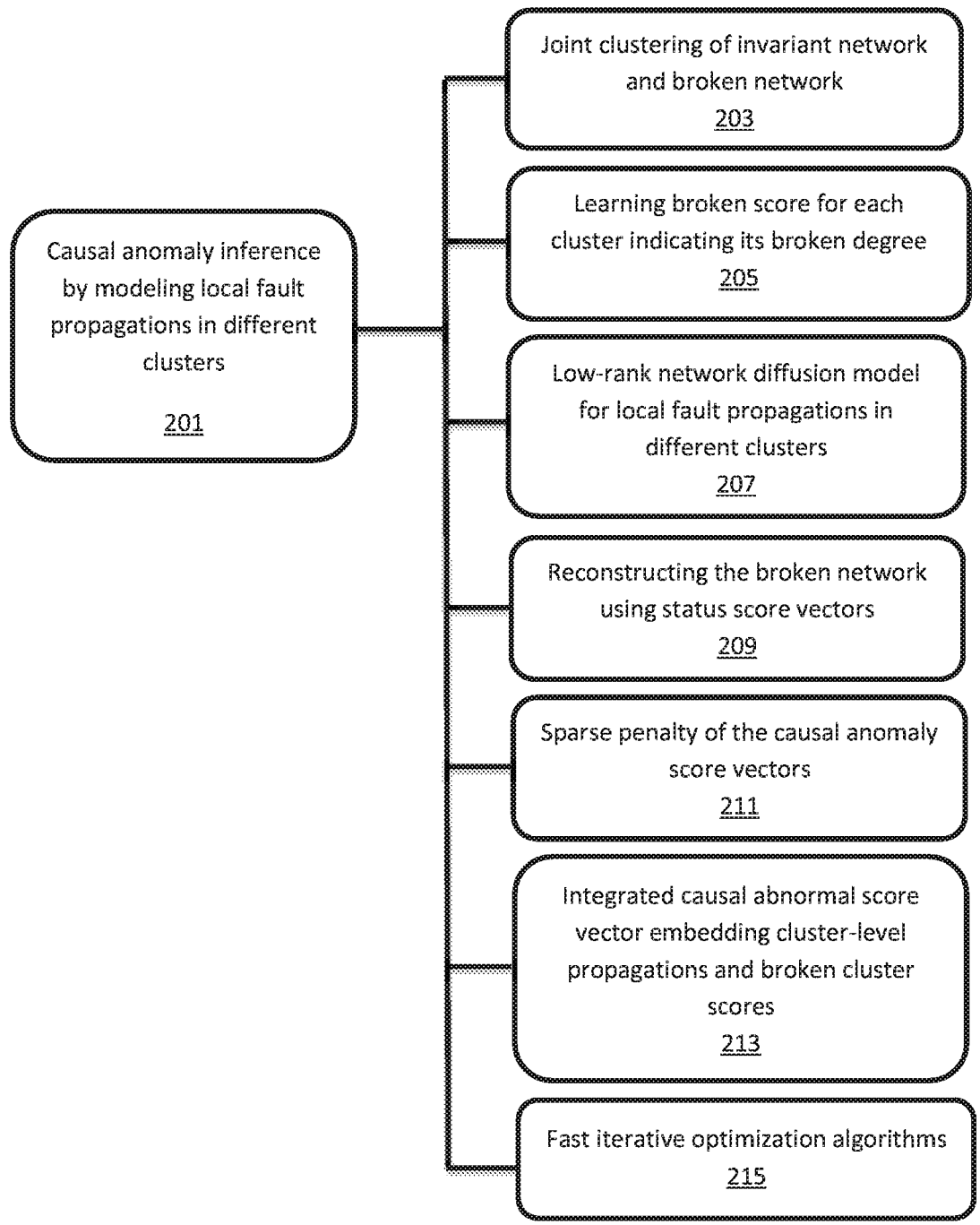
FIG. 2 is a block/flow diagram of causal anomaly inference enabled by modeling local fault propagations in different clusters, in accordance with embodiments of the present invention.

FIG. 2 is a block/flow diagram of causal anomaly inference enabled by modeling local fault propagations in different clusters, in accordance with embodiments of the present invention.

At block 201, causal anomaly inference is achieved by modeling local fault propagations in different clusters, as described in blocks 203-215.

At block 203, an invariant network and a broken network are jointly clustered.

At block 205, a broken score is learned for each cluster indicating its broken degree.

At block 207, a low-rank network diffusion model is provided for local fault propagations in different clusters.

At block 209, the broken network is reconstructed by using status score vectors.

At block 211, penalties of the causal anomaly score vectors are sparsed.

At block 213, causal abnormal score vector embedding cluster-level propagations and broken cluster scores are integrated.

At block 215, a fast iterative optimization algorithm is implemented.

The invariant network and broken network clustering solution, broken score learning solution, and low-rank network diffusion solution are unique. Existing works on anomaly detection can be classified into two categories, the first does not consider fault propagations and the second considers fault propagations. It has been shown that considering fault propagation can improve anomaly detection accuracy. However, existing works model fault propagations in a whole network and are unware of the local fault propagations in different clusters. Because existing fault propagation based anomaly inference approaches assume the fault propagation can spread throughout a whole invariant network, their model cannot accurately reflect the true, local propagation patterns of causal anomaly impacts in different clusters in the invariant network. In contrast, the proposed systems and methods have a different hypothesis. It is assumed that causal anomalies propagate their impacts in different clusters and seldom go outside their clusters. The approach described herein simulates such local propagation patterns by solving an optimization problem. By solving the optimization problem, the systems and methods of the present invention can effectively backtrack those initial, seeding anomalies that are responsible for damages of the clusters (or functional modules) in a system.

Figure 3:
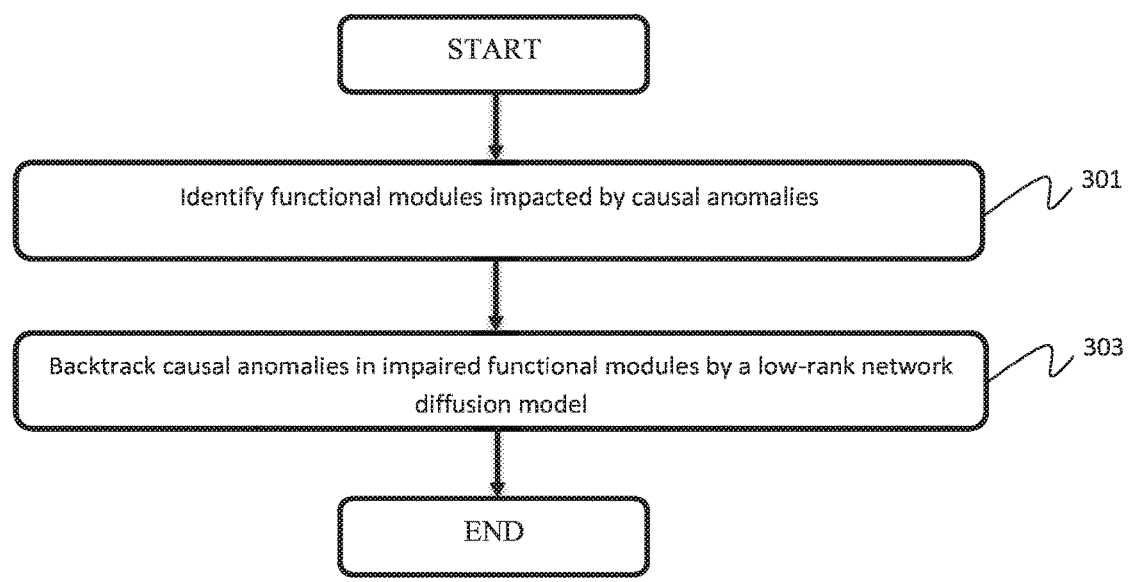
FIG. 3 is a block/flow diagram of a method for fault diagnosis by causal anomaly inference, in accordance with embodiments of the present invention.

FIG. 3 is a block/flow diagram of a method for simultaneous metric learning and variable selection in non-linear regression, in accordance with embodiments of the present invention.

At block 301, functional modules impacted by causal anomalies are identified.

At block 303, causal anomalies in impaired functional modules are backtracked by a low-rank network diffusion model.

In summary, the exemplary embodiments of the present invention present a cluster ranking based fault diagnosis (CRD) system and method for locating true causal anomalies for a system fault. CRD is a two-phase framework. It takes as input an invariant network and a broken network. In the first phase, a cluster ranking problem is solved. The goal is to jointly cluster the invariant network and the broken network, and at the same time learn the degrees of broken severities of different clusters. In the second phase, a low-rank network diffusion model is provided to backtrack causal anomalies with guidance from the results of the first phase. The benefits are two-fold. First, CRD can narrow down the search space of causal anomalies by looking primarily at severely broken clusters. Second, CRD can accurately model the local propagation patterns of causal anomaly impacts in different clusters.

The proposed systems and methods can significantly improve accuracy of causal anomaly inference when diagnosing system faults. Moreover, the proposed systems and methods run fast, approximately 2 to 3 seconds to run on large-scale systems that are equipped with thousands of sensors. Considering its effectiveness and efficiency, it is believed to have considerable practical values when working on complex real-life systems, such as information systems, power plant, manufacturing lines, computer network systems, etc. By accurately locating true causal anomalies, human operators can save great amount of efforts in diagnosing, repairing, and maintaining large-scale systems.

Figure 4:
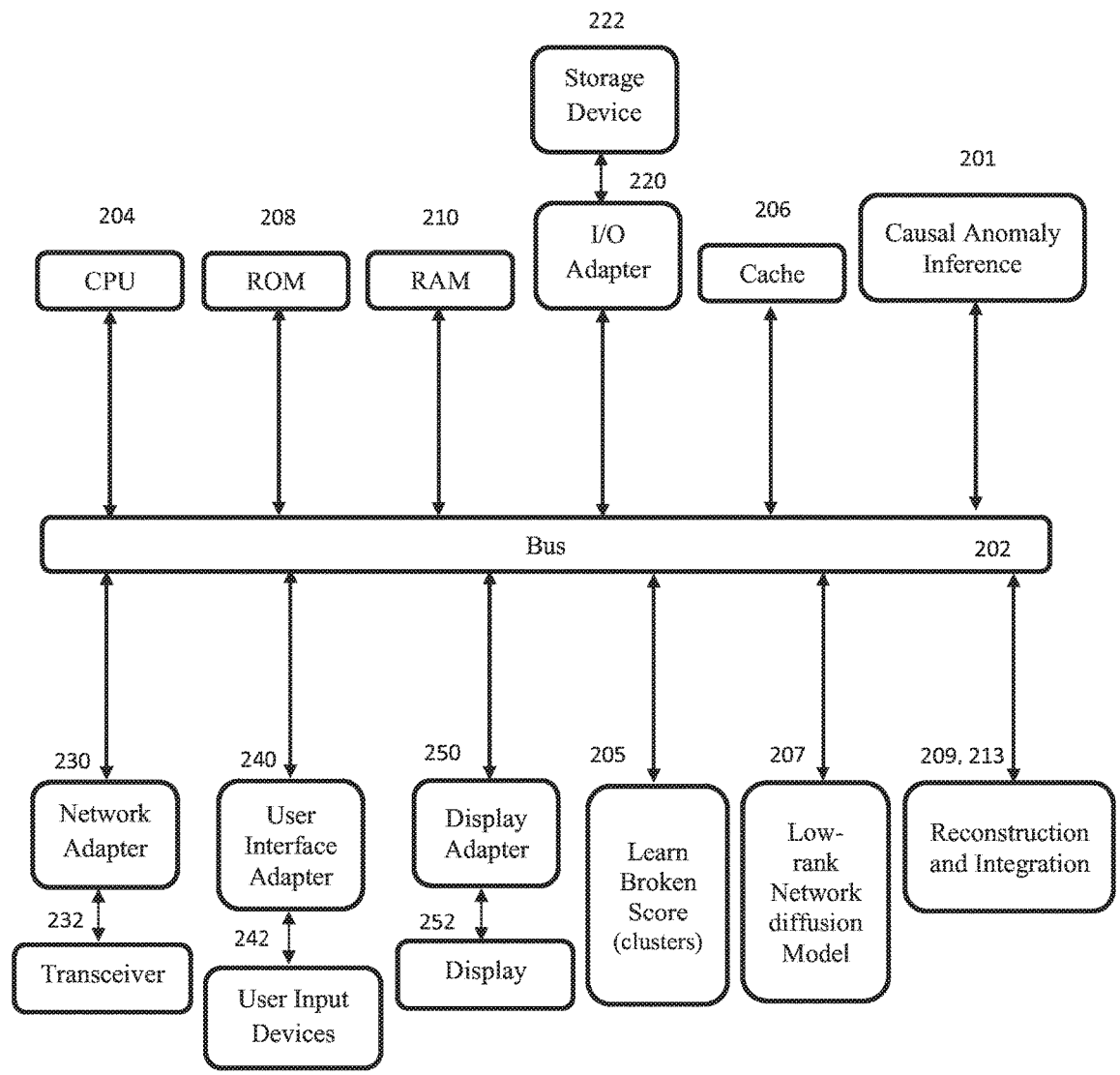
FIG. 4 is an exemplary processing system for fault diagnosis by causal anomaly inference, in accordance with embodiments of the present invention.

FIG. 4 is an exemplary processing system for fault diagnosis by causal anomaly inference, in accordance with embodiments of the present invention.

The processing system includes at least one processor (CPU) 204 operatively coupled to other components via a system bus 202. A cache 206, a Read Only Memory (ROM) 208, a Random Access Memory (RAM) 210, an input/output (I/O) adapter 220, a network adapter 230, a user interface adapter 240, and a display adapter 250, are operatively coupled to the system bus 202. Additionally, a causal anomaly inference module 201, a broken score learning module 205, a low-rank network diffusion model 207, and reconstruction and integration modules 209, 213 are operatively coupled to the system bus 202.

A storage device 222 is operatively coupled to system bus 202 by the I/O adapter 220. The storage device 222 can be any of a disk storage device (e.g., a magnetic or optical disk storage device), a solid state magnetic device, and so forth.

A transceiver 232 is operatively coupled to system bus 202 by network adapter 230.

User input devices 242 are operatively coupled to system bus 202 by user interface adapter 240. The user input devices 242 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 242 can be the same type of user input device or different types of user input devices. The user input devices 242 are used to input and output information to and from the processing system.

A display device 252 is operatively coupled to system bus 202 by display adapter 250.

Of course, the processing system may also include other elements (not shown), as readily contemplated by one of skill in the art, as well as omit certain elements. For example, various other input devices and/or output devices can be included in the system, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system are readily contemplated by one of ordinary skill in the art given the teachings of the present invention provided herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical data storage device, a magnetic data storage device, or any suitable combination of the foregoing. In the context of this document, a computer readable storage medium may be any tangible medium that can include, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method executed on a processor for diagnosing system faults by fine-grained causal anomaly inference, the method comprising:
   inputting an invariant network and a broken network;
   identifying functional modules impacted by causal anomalies; and
   backtracking causal anomalies in impaired functional modules by a low-rank network diffusion model;
   wherein the invariant and broken networks are processed by a network clustering and broken cluster score learning module and a causal anomaly inference module; and
   wherein the network clustering and broken cluster score learning module includes an invariant network clustering module employing stochastic matrix decomposition and a broken cluster learning module for learning a broken score for each cluster in the broken network to indicate a broken degree for each cluster.

2. A computer-implemented method executed on a processor for diagnosing system faults by fine-grained causal anomaly inference, the method comprising:
   inputting an invariant network and a broken network;
   identifying functional modules impacted by causal anomalies; and
   backtracking causal anomalies in impaired functional modules by a low-rank network diffusion model;
   wherein the invariant and broken networks are processed by a network clustering and broken cluster score learning module and a causal anomaly inference module; and
   wherein the causal anomaly inference model includes a label propagation module, a reconstruction error module, and an optimization module for computing causal anomaly vectors for each cluster in the invariant network.

3. A computer-implemented method executed on a processor for diagnosing system faults by fine-grained causal anomaly inference, the method comprising:
   inputting an invariant network and a broken network;
   identifying functional modules impacted by causal anomalies; and
   backtracking causal anomalies in impaired functional modules by a low-rank network diffusion model;
   wherein the invariant and broken networks are processed by a network clustering and broken cluster score learning module and a causal anomaly inference module;
   wherein the causal anomaly inference model includes a label propagation module, a reconstruction error module, and an optimization module for computing causal anomaly vectors for each cluster in the invariant network; and
   wherein clustering results, broken cluster score results, and anomaly score results are combined into a causal anomaly score vector to reflect multiple fault propagations in different clusters in the invariant network.

4. A system for diagnosing system faults by fine-grained causal anomaly inference, the system comprising:
   a memory; and
   a processor in communication with the memory, wherein the processor is configured to:
   identify functional modules impacted by causal anomalies; and
   backtrack causal anomalies in impaired functional modules by a low-rank network diffusion model;
   wherein an invariant network and a broken network are inputted into the system;
   wherein the invariant and broken networks are processed by a network clustering broken cluster score learning module and a causal anomaly inference module; and
   wherein the network clustering and broken cluster score learning module includes an invariant network clustering module employing stochastic matrix decomposition and a broken cluster learning module for learning a broken score for each cluster in the broken network to indicate a broken degree for each cluster.

5. A system for diagnosing system faults by fine-grained causal anomaly inference, the system comprising:
   a memory; and
   a processor in communication with the memory, wherein the processor is configured to:
   identify functional modules impacted by causal anomalies; and backtrack causal anomalies in impaired functional modules by a low-rank network diffusion model;

wherein an invariant network and a broken network are inputted into the system;

wherein the invariant and broken networks are processed by a network clustering broken cluster score learning module and a causal anomaly inference module; and wherein the causal anomaly inference module includes a label propagation module, a reconstruction error module, and an optimization module for computing causal anomaly vectors for each cluster in the invariant network.

6. A system for diagnosing system faults by fine-grained causal anomaly inference, the system comprising:

a memory; and a processor in communication with the memory, wherein the processor is configured to:

identify functional modules impacted by causal anomalies; and backtrack causal anomalies in impaired functional modules by a low-rank network diffusion model;

wherein an invariant network and a broken network are inputted into the system;

wherein the invariant and broken networks are processed by a network clustering broken cluster score learning module and a causal anomaly inference module;

wherein the causal anomaly inference module includes a label propagation module, a reconstruction error module, and an optimization module for computing causal anomaly vectors for each cluster in the invariant network; and wherein clustering results, broken cluster score results, and anomaly score results are combined into a causal anomaly score vector to reflect multiple fault propagations in different clusters in the invariant network.

7. A non-transitory computer-readable storage medium comprising a computer-readable program for diagnosing system faults by fine-grained causal inference, wherein the computer-readable program when executed on a computer causes the computer to perform the steps of:

identifying functional modules impacted by causal anomalies; and backtracking causal anomalies in impaired functional modules by a low-rank network diffusion model;

wherein the network clustering and broken cluster score learning module includes an invariant network clustering module employing stochastic matrix decomposition and a broken cluster learning module for learning a broken score for each cluster in the broken network to indicate a broken degree for each cluster; and wherein the causal anomaly inference module includes a label propagation module, a reconstruction error module, and an optimization module for computing causal anomaly vectors for each cluster in the invariant network.

* * * * *